United States Patent [19]

Adelmann et al.

[11] 4,143,024

[45] * Mar. 6, 1979

[54] THERMOPLASTIC POLYCARBONATE MOULDING COMPOSITIONS WITH IMPROVED EASE OF MOULD RELEASE

[75] Inventors: Siegfried Adelmann; Dieter Margotte; Hugo Vernaleken; Werner Nouvertne, all of Krefeld, Fed. Rep. of Germany

[73] Assignee: Bayer Aktiengesellschaft, Leverkusen, Fed. Rep. of Germany

[*] Notice: The portion of the term of this patent subsequent to Dec. 27, 1994, has been disclaimed.

[21] Appl. No.: 793,011

[22] Filed: May 2, 1977

Related U.S. Application Data

[63] Continuation-in-part of Ser. No. 710,069, Jul. 30, 1976, Pat. No. 4,065,436.

[30] Foreign Application Priority Data

May 7, 1976 [DE] Fed. Rep. of Germany ....... 2620257
Feb. 26, 1977 [DE] Fed. Rep. of Germany ....... 2708467

[51] Int. Cl.² .................... C08L 69/00; C10M 7/24
[52] U.S. Cl. .................. 260/31.2 XA; 260/18 TN; 260/31.2 R; 264/300; 264/328
[58] Field of Search .............. 260/47, 18 TN, 31.2 R, 260/77.5 D; 264/300, 328

[56] References Cited

U.S. PATENT DOCUMENTS

| | | | |
|---|---|---|---|
| 3,186,961 | 6/1965 | Sears | 260/30.4 |
| 3,254,047 | 5/1966 | Caldwell et al. | 260/33.2 |
| 3,784,595 | 1/1974 | Schirmer et al. | 260/18 TN |
| 3,836,499 | 9/1974 | Schirmer et al. | 260/31.2 R |

Primary Examiner—Theodore E. Pertilla
Attorney, Agent, or Firm—Gene Harsh; Lawrence S. Pope

[57] ABSTRACT

The invention relates to a thermoplastic moulding composition comprising a high molecular, thermoplastic aromatic polycarbonate based on an aromatic dihydroxy compound and containing 0,01 to 0.5% by weight of an ester of a saturated aliphatic carboxylic acid with 10 to 20 C. atoms per molecule and an aromatic hydroxy compound with from 1 to 6 OH groups.

8 Claims, No Drawings

THERMOPLASTIC POLYCARBONATE MOULDING COMPOSITIONS WITH IMPROVED EASE OF MOULD RELEASE

This application is a continuation-in-part of application Ser. No. 710,069 filed July 30, 1976, now U.S. Pat. No. 4065436 filed Dec. 27, 1977.

The invention relates to thermoplastic moulding compositions of high-molecular thermoplastic, aromatic polycarbonates based on aromatic dihydroxy compounds and containing 0.01–0.5%, preferably 0.05–0.1% by weight of an ester of a saturated aliphatic carboxylic acid with 10 to 20 C atoms per molecule and an aromatic hydroxy compound with from 1 to 6 OH groups.

High-molecular, thermoplastic, aromatic polycarbonates are used in numerous technical fields of use, because of their typical tough and elastic properties. A disadvantage is their difficulty of mould release when injection moulded, which frequently results in relatively long cycle times. However, for economic and technical reasons it is desirable to shorten the cycle times as far as possible in order to produce a larger number of mouldings per unit time on the injection moulding machines. This can be achieved by mould release at higher temperatures. It is therefore desirable to modify the polycarbonate melt in such a way that the release of the moulding from the mould wall takes place with low release forces and at high temperatures, without sticking of the solidified melt. Ease of mould release at high temperatures is also particularly desirable for complicated mouldings which are processed in moulds comprising parts which cannot be cooled (for example webs, cores and the like). Undesirable sticking of the mouldings and damage to the moulds on detaching the mouldings (breakage of pins and the like) are a frequent consequence, coupled with extended time losses.

Up until now mould release with esters of aliphatic alcohols has been known (see DOS (German Published Specification) No. 2,064,059 (Le A 13,461), DOS (German Published Specification) No. 2,220,185 (Le A 14 329) and JAS (Japanese Published Specification) Sho 47-41092, DOS (German Published Specification) No. 2,507,748 (Le A 16 284); according to the latter application the polycarbonate compositions exhibiting ease of mould release do not show any decrease in mechanical properties even after being subjected to heat for a considerable length of time.

On the other hand it was surprising that according to the present invention phenol esters are effective as mould release auxiliaries without causing decomposition of the polycarbonate as a result of trans-esterification. Beyond this it was not to be expected that partial esters of aromatic hydroxy compounds with aliphatic carboxylic acids are also suitable as mould release auxiliaries because of the free aromatic hydroxyl groups, without adversely affecting the properties of the polycarbonate to be released from the mould.

The subject of the present invention are thermoplastic moulding compositions of high-molecular, thermoplastic, aromatic polycarbonates based on aromatic dihydroxy compounds containing 0.01–0.5, preferably 0.05–0.1, % by weight of an ester of saturated aliphatic carboxylic acids with 10 to 20 C atoms and aromatic hydroxy compounds with 1 to 6 hydroxyl groups.

Esters suitable according to the invention of saturated aliphatic $C_{10}$–$C_{20}$ carboxylic acids and aromatic hydroxy compounds with 1 to 6 OH groups are those compounds obtainable by esterification of the aromatic hydroxy compounds with the named carboxylic acids. According to the invention these are on the one hand those resulting from complete esterification of the 1 to 6 OH groups of the aromatic hydroxy compound with one or more than one of the $C_{10}$–$C_{20}$ carboxylic acids in question and on the other hand the partial esters resulting from partial esterification of the 1 to 6 OH groups of the aromatic hydroxy compounds with one or more than one of the $C_{10}$–$C_{20}$ carboxylic acids in question. Also suitable according to the invention are mixtures of these partial esters and the afore-mentioned completely esterified compounds.

The surprising feature of the invention is that, in contrast to the known processes, even when using mono-, di-, or tri-phenol esters according to the present invention, small amounts suffice to achieve an ease of mould release adequate for all fields of use.

The polycarbonate moulding compositions according to the invention are ditinguished by outstanding ease of mould release, a particular advantage being that the mould release can be effected over a wide temperature range. This permits short injection cycles, regardless of temperature fluctuations in the injection mould, which is a great advantage for the plastics processor.

The mechanical properties and the long-term use properties of the polycarbonates which have been rendered easily releasable from the mould in accordance with the present invention, are identical with those of the pure polycarbonates. Even prolonged heat exposure (130° C. for more than 300 hours) causes no observable deterioration in the mechanical properties and no degradation of the molecular weight.

By aromatic polycarbonates, in the sense of the present invention, there are understood homopolycarbonates and copolycarbonates which are based, for example, on one or more of the following bisphenols: hydroquinone, resorcinol, dihydroxydiphenyls, bis-(hydroxyphenyl)-alkanes, bis-(hydroxyphenyl)-cycloalkanes, bis-(hydroxyphenyl)-sulphides, bis-(hydroxyphenyl)-ethers, bis-(hydroxyphenyl)-ketones, bis-(hydroxyphenyl)-sulphoxides, bis-(hydroxyphenyl)-sulphones and α,α-bis-(hydroxyphenyl)-diisopropyl-benzenes, as well as their nuclear-alkylated and nuclear-halogenated compounds. These and further suitable aromatic dihydroxy compound are described, for example, in U.S. Patent Specifications Nos. 3,028,365, 2,999,835, 3,148,172, 3,271,368, 2,991,273, 3,271,367, 3,280,078, 3,014,891 and 2,999,846, in German Offenlegungsschriften (German Published Specifications) Nos. 1,570,703, 2,063,050, 2,063,052, 2,211,956 and 2,211,957, in French Patent Specification No. 1,561,518 and in the monograph "H. Schnell, Chemistry and Physics of Polycarbonates, Interscience Publishers, New York, 1964".

Preferred bisphenols are those of the formula I

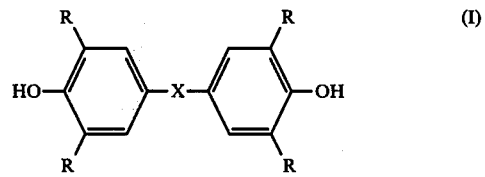

in which
R is identical or different and denotes H, $C_1$–$C_4$-alkyl, Cl or Br and in which X is a bond, $C_1$–$C_8$-alkylene, $C_2$–$C_8$-alkylidene, $C_5$–$C_{15}$-cycloalkylene, $C_5$–$C_{15}$-cycloalkylidene, —$SO_2$— or

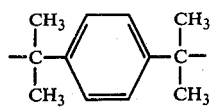

Examples of these bisphenols are: 4,4'-dihydroxydiphenyl, 2,2-bis-(4-hydroxyphenyl)-propane, 2,4-bis-(4-hydroxyphenyl)-2-methylbutane, 1,1-bis-(4-hydroxyphenyl)-cyclohexane, α,α-bis-(4-hydroxyphenyl)-p-diisopropylbenzene, 2,2-bis-(3-methyl-4-hydroxyphenyl)-propane, 2,2-bis-(3-chloro-4-hydroxyphenyl)-propane, bis-(3,5-dimethyl-4-hydroxyphenyl)-methane, 2,2-bis-(3,5-dimethyl-4-hydroxyphenyl)-propane, bis-(3,5-dimethyl-4-hydroxyphenyl)-sulphone, 2,4-bis-(3,5-dimethyl-4-hydroxyphenyl)-2-methylbutane, 1,1-bis-(3,5-dimethyl-4-hydroxyphenyl)-cyclohexane, α,α-bis-(3,5-dimethyl-4-hydroxyphenyl)-p-diisopropyl-benzene, 2,2-bis-(3,5-dichloro-4-hydroxyphenyl)-propane and 2,2-bis-(3,5-dibromo-4-hydroxyphenyl)propane.

Examples of particularly preferred bisphenols are: 2,2-bis-(4-hydroxyphenyl)-propane, 2,2-bis-(3,5-dimethyl-4-hydroxyphenyl)-propane, 2,2-bis-(3,5-dichloro-4-hydroxyphenyl)-propane, 2,2-bis-(3,5-dibromo-4-hydroxyphenyl)-propane and 1,1-bis-(4-hydroxyphenyl)-cyclohexane.

Preferred aromatic polycarbonates are those which are based on one or more of the bisphenols mentioned as being preferred. Particularly preferred copolycarbonates are those based on 2,2-bis-(4-hydroxyphenyl)-propane and one of the other bisphenols mentioned as being particularly preferred. Further particularly preferred polycarbonates are those based solely on 2,2-bis-(4-hydroxyphenyl)-propane or 2,2-bis-(3,5-dimethyl-4-hydroxyphenyl)-propane.

The aromatic polycarbonates can be prepared in accordance with known processes, such as, for example, in accordance with the melt trans-esterification process from bisphenols and diphenyl carbonate and the two-phase boundary process from bis-phenols and phosgene, as described in the abovementioned literature.

The aromatic high-molecular weight polycarbonates can be branched due to the incorporation of small amounts, preferably of between 0.05 and 2.0 mol % (relative to diphenols employed), of trifunctional or more than trifunctional compounds, especially compounds with three or more phenolic hydroxyl groups.

Polycarbonates of this type are described, for example, in German Offenlegungsschriften (German Published Specifications) Nos. 1,570,533, 1,595,762, 2,116,974 and 2,113,347, British Patent Specification No. 1,079,821, U.S. Patent Specification No. 3,544,514 and German Patent Application No. P 25 00 092.4 (Le A 16 142).

Some examples of compounds with three or more than three phenolic hydroxyl groups which can be used are phloroglucinol, 4,6-dimethyl-2,4,6-tri-(4-hydroxyphenyl)-heptane-2, 4,6-dimethyl-2,4,6-tri-(4-hydroxyphenyl)-heptane, 1,4,5-tri-(4-hydroxyphenyl)-benzene, 1,1,1-tri-(4-hydroxyphenyl)-ethane, tri-(4-hydroxyphenyl)-phenylmethane, 2,2-bis-[4,4-bis-(4-hydroxyphenyl)-cyclohexyl]-propane, 2,4-bis-(4-hydroxyphenylisopropyl)-phenol, 2,6-bis-(2-hydroxy-5'-methylbenzyl)-4-methylphenol, 2-(4-hydroxyphenyl)-2-(2,4-dihydroxyphenyl)-propane, hexa(4-(4-hydroxyphenylisopropyl)phenyl) orthoterephthalic acid ester, tetra-(4-hydroxyphenyl)-methane, tetra-(4-(4-hydroxyphenylisopropyl)-phenoxy)-methane and 1,4-bis-((4',4"-dihydroxytriphenyl)-methyl)-benzene. Some of the other trifunctional compounds are 2,4-dihydroxybenzoic acid, trimesic acid, cyanuric chloride and 3,3-bis-(4-hydroxyphenyl)-2-oxo-2,3-dihydroindole.

The aromatic high-molecular polycarbonates should as a rule have mean weight-average molecular weights $\overline{M}_w$ of at least 10,000, especially of 10,000 to 200,000, preferably of 20,000 to 80,000, determined by measuring the relative viscosity in $CH_2Cl_2$ at 25° C. and a concentration of 0.5% by weight.

The esters which are effective according to the present invention are reaction products of 1–6-hydric aromatic hydroxy compounds, such as, for example, phenol, pyrocatechol, resocinol, hydroquinone, phloroglucinol, pyrogallol, hydroxyhydroquinone, hexahydroxybenzene, 2,2-bis-(4-hydroxyphenyl)-propane (bisphenol A), 2,2-bis-(3,5-dimethyl-4-hydroxyphenyl)-propane (tetramethylbisphenol A), 2,2-bis-(3,5-dichloro-4-hydroxyphenyl)-propane (tetrachlorobisphenol A), 2,2-bis-(3,5-dibromo-4-hydroxyphenyl)-propane (tetrabromobisphenol A), 4,4'-dihydroxy-tetraphenylmethane, 1,4-bis-(4',4"-dihydroxytriphenyl)-methyl)benzene, naphthol, anthrahydroquinone or dihydroxynaphthalene, with saturated aliphatic carboxylic acids with 10 to 20 C atoms.

All aliphatic saturated monocarboxylic acids between capric acid ($C_{10}$) and eicosanoic acid ($C_{20}$) are suitable, for example capric acid, undecanoic acid, lauric acid, tridecanoic acid, myristic acid, pentadecanoic acid, palmitic acid, margaric acid, stearic acid, nonadecanoic acid and eicosanoic acid.

Myristic acid, palmitic acid and stearic acid are used preferentially.

Small amounts of polycarboxylic acids with 2 to 20 C atoms, for example oxalic acid, malonic acid, adipic acid, sebacic acid, undecanedioic acid, dodecanedioic acid, brassylic acid, thapsic acid and others can, if appropriate, be used conjointly, to increase the molecular weight of the esters of aromatic hydroxy compounds which are effective in accordance with the invention. For this purpose, in general, 5–10 mol % are employed, relative to the total molar amount of monocarboxylic acid esters and polycarboxylic acid esters in the particular ester which is effective according to the invention.

Examples of esters to be used according to the invention are: phenyl stearate, bisphenol A distearate, tetramethylbisphenol A dipalmitate, hydroquinone distearate, phloroglucinol tripalmitate, 1,4-bis-((4,4'-dihydroxy-triphenyl)-benzene tetramyristate, 4,4'-dihydroxy-tetraphenylmethane distearate, hexahydroxybenzene hexastearate and phloroglucinol trilaurate.

Partial esters to be used according to the invention are for example: phloroglucinol distearate, phloroglucinol palmitate with an OH number of 45, — this corresponds to a mixture of approx. 50 parts phloroglucinol palmitate and approx. 50 parts phloroglucinol tripalmitate — or 1,4-bis((4,4'-dihydroxy-triphenyl) methyl)-benzene tetramyristate, and hexahydroxybenzene pentastearate.

The use of single-compound esters of stearic acid and palmitic with bisphenol A, tetramethylbisphenol A or hydroquinone is preferred.

Preferred partial esters are phloroglucinol distearate, tetramethyl-bisphenol A-palmitate, 1,4-bis-((4,4'-dihydroxytriphenyl)methyl)benzene tristearate.

Mixtures of the esters, according to the invention, of the saturated aliphatic $C_{10}$–$C_{20}$-carboxylic acids and the aromatics containing 1–6 OH groups are also suitable, e.g.:

Mixtures of bisphenol A distearate and phloroglucinol tripalmitate or hydroquinone distearate and phloroglucinol dipalmitate or phloroglucinol dipalmitate and 1,4-bis-((4,4'-dihydroxy-triphenyl)-methyl)benzene tristearate.

The term aromatic hydroxy compounds also embraces oligomeric and polymeric compounds with phenolic OH groups, for example those of the polycarbonate and novolac type with molecular weights $\overline{M}_w$ (weight-average) of up to about 1,200.

The oligomeric polycarbonates are obtained, for example, by melt trans-esterification of bisphenols with diaryl carbonates; thereafter, the reaction with the $C_{10}$–$C_{20}$-fatty acid chlorides, to give the esters which are effective according to the invention, is carried out.

Novolacs are prepared according to conventional processes, by acid condensation of phenols with formaldehyde; thereafter, a reaction with the acid chlorides of the aliphatic, saturated $C_{10}$–$C_{20}$-monocarboxylic acids, to give the esters which are effective according to the invention, is carried out.

The carboxylic acid esters to be used according to the invention are prepared in accordance with customary processes, for example in accordance with the Einhorn process, using pyridine as the acid-binding agent, or from the aromatic hydroxy compound and the acid chloride, in an inert solvent.

Such processes are described, for example, in "HoubenWeyl, Methoden der organischen Chemie" (Methods of Organic Chemistry), Georg Thieme Verlag, Stuttgart, 1952, 4th edition, volume VIII, page 516 et seq.

Up to 50 carboxyl equivalents of the monocarboxylic acids to be used can be replaced by carboxyl equivalents of the abovementioned polycarboxylic acids with 2 to 20 C atoms, in particular those of aliphatic $C_2$–$C_{20}$ dicarboxylic acids.

Besides aliphatic polycarboxylic acids, aromatic polycarboxylic acids, such as trimesic acid, can also be used. The partial esters suitable according to the invention and produced with the incorporation of polycarboxylic acids should preferably have average number molecular weights $\overline{M}_n$ of less than 5,000, in particular of less than 3,000.

The carboxylic acid esters to be used according to the invention are incorporated into the high-molecular, thermoplastic polycarbonates by, for example, applying the substances, which are normally in the form of powders, onto the granules of the polycarbonate by tumbling, and then extruding the material, by means of a twin-screw extruder, at 280° C., to give a strand which is granulated. However, the mould release agent can already be incorporated during the preparation of the solid polycarbonate. In that case, the ester is either added to the polycarbonate, as a solution in a solvent, before the devolatilisation screw is reached, or is metered into the polycarbonate melt without using a solvent.

The addition of the esters to be used according to the invention does not have an adverse effect on either the transparency or the colour. If desired, dyestuffs, pigments, stabilisers, flameproofing agents or fillers, such as glass fibres, can also be added to the polycarbonate without thereby detracting from the effectiveness of the mould release agent.

The thermoplastic polycarbonate moulding compositions according to the invention find use wherever mouldings are produced fully automatically by the injection moulding process, in long runs and with short cycle times. This is true, for example, for use in the electrical industry and the optical field, for example for strips of sockets, coil bodies, complicated housings, such as projector housings, bottoms of switch cabinets and the like, and for particularly complicated mouldings which are moulded in moulds in which there are regions with greatly different temperatures. When producing such articles, no mould release difficulties arise even at elevated temperature.

The effectiveness of the esters to be used according to the invention is measured in terms of the mould release forces required when releasing injection moulding compositions from the mould. In the examples which follow, these forces are measured by rendering the pressure, which builds up in the oil cylinder of the ejector system during mould release, visible by means of an optical indicator instrument which at the same time acts as a pen recorder.

The examples which follow are intended to explain the subject of the invention in more detail:

I. The aromatic polycarbonates used.

General instructions for the preparation of polycarbonates

About 454 parts of 4,4'-dihydroxydiphenyl-2,2-propane and 9.5 parts of p-tert.-butylphenol are suspended in 1.5 l of water. The oxygen is removed from the reaction mixture in a 3-necked flask, equipped with a stirrer and gas inlet tube, by passing nitrogen through the reaction mixture for 15 minutes, whilst stirring. 355 parts of 45% strength sodium hydroxide solution and 1,000 parts of methylene chloride are then added. The mixture is cooled to 25° C. Whilst maintaining this temperature by cooling, 237 parts of phosgene are added over a period of 120 minutes. An additional amount of 75 parts of a 45% strength sodium hydroxide solution is added after 15–30 minutes or after the absorption of phosgene has started. 1.6 parts of triethylamine are added to the resulting solution and the mixture is stirred for a further 15 minutes. A very viscous solution is obtained, the viscosity of which is regulated by adding methylene chloride. The aqueous phase is separated off. The organic phase is washed with water until free from salt and alkali. The polycarbonate is isolated from the washed solution, and dried. The polycarbonate has a relative viscosity of 1.29–1.30, measured on an 0.5% strength methylene chloride solution at 20° C. This corresponds approximately to a molecular weight of 32,000. The polycarbonate thus obtained is extruded and granulated.

A. An aromatic polycarbonate based on 4,4'-dihydroxydiphenylpropane-2,2 (bisphenol A) having a relative viscosity of $\eta_{rel} = 1.30$, $M_{LS} = 28,000$.

The viscosities are measured at 25° C. in methylene chloride at a concentration of 5 g/l.

B. An aromatic polycarbonate based on 90 mol % of bisphenol A and 10 mol % of 4,4'-dihydroxy-3,3',5,5'-tetrabromodiphenylpropane-2,2 (tetrabromobisphenol A) having a relative viscosity of $\eta_{rel} = 1.33$, $M_{LS} = 37,000$.

C. An aromatic polycarbonate based on 70 mol % of bisphenol A and 30 mol % of 4,4'-dihydroxy-3,3',5,5'-tetramethyl-diphenylpropane-2,2 (tetramethylbisphenol A) having a relative viscosity of $\eta_{rel} = 1.28$, $M_{LS} = 30,000$.

II. The mould release agents used

D. Bisphenol A distearate, melting point 67° C.
E. Hydroquinone dipalmitate, melting point 90° C.
F. Phloroglucinol trilaurate, melting point 64° C.
G. Tetramethylbisphenol A distearate, melting point 63° C.
G.1. Phloroglucinol distearate melting point 72° C.
G.2. 1,4-bis((4,4'-dihydroxy- melting point 89° C. triphenyl)methyl)benzene tristearate
H. (Comparative example) Triglyceride with acid groups of palmitic acid, stearic acid and myristic acid in the ratio of 1:1:0.1, melting point 48° C. (Compare DT-OS (German Published Specification) No. 2,064,095).
H.1. (Comparative example)
Pentaerythritol tetrastearate melting point 76° C.

Example of the preparation of a mould release auxiliary:
Phloroglucinol distearate 37.8 g (0.3 mol) phloroglucinol are dissolved in 0.9 l toluene and 60 ml pyridine and heated to 100° C. 181.8 g (0.6 mol) stearoylic chloride are added dropwise to this within 40 min. The solution is boiled (approx. 110° C.) for an hour with refluxing. After cooling, the mixture is acidified with dilute hydrochloric acid, subsequently washed with water until neutral and dried with anhydrous sodium sulphate. After concentration of the organic phase the phloroglucinol distearate crystallizes out. It is recrystallized from ethanol. A product is obtained with a melting-point of 72° C., an acid number of approx. 1 and an OH number of 88 (= approx. 2.67% OH).

EXAMPLES 1 to 13

Examples 1,4 and 6 correspond to the polycarbonates A, B and C without mould release auxiliaries.

The mould release behaviour of the polycarbonates of Examples 1-13 is tested on a conical cylinder of 35 mm length, diameters 40-42 mm and wall thickness 2 mm, by measuring the pressure which builds up in the ejector system. The mould release pressures and temperatures are shown in Table 1.

Mouldings injection-moulded from the polycarbonates of Examples 1-13 at 270° C. have the properties described in Table 2.

EXAMPLE 2

0.1 kg of mould release auxiliary D is applied to 99.9 kg of polycarbonate A by tumbling in a drum at room temperature and the material is then extruded on an extruder at 280° C. to give a strand which is granulated. The mould release behaviour is tested as in Example 1. The properties are described in Tables 1 and 2.

EXAMPLE 3

0.01 kg of mould release auxiliary D is applied to 99.99 kg of polycarbonate A by tumbling in a drum at room temperature and the material is then extruded on an extruder at 280° C. to give a strand which is granulated. The mould release behaviour is tested as in Example 1. The properties are described in Tables 1 and 2.

EXAMPLE 5

0.1 kg of mould release auxiliary E is applied to 99.9 kg of polycarbonate B by tumbling in a drum at room temperature and the material is then extruded on an extruder at 310° C. to give a strand which is granulated. The mould release behaviour is tested as in Example 1. The properties are described in Tables 1 and 2.

EXAMPLE 7

0.1 kg of mould release auxiliary F is applied to 99.9 kg of polycarbonate C by tumbling in a drum at room temperature and the material is then extruded on an extruder at 300° C. to give a strand which is granulated. The mould release behaviour is tested as in Example 1. The properties are described in Tables 1 and 2.

EXAMPLE 8

0.1 kg of mould release auxiliary G is applied to 99.9 kg of polycarbonate A by tumbling in a drum at room temperature and the material is then extruded on an extruder at 280° C. to a give a strand which is granulated. The mould release behaviour is tested as in Example 1. The properties are described in Tables 1 and 2.

EXAMPLE 9 (COMPARATIVE EXAMPLE)

0.5 kg of mould release auxiliary H is applied to 99.5 kg of polycarbonate A by tumbling in a drum at room temperature and the material is then extruded on an extruder at 280° C. to give a strand which is granulated. The mould release behaviour is tested as in Example 1. The properties are described in Tables 1 and 2.

EXAMPLE 10 (COMPARATIVE EXAMPLE)

0.1 kg mould release auxiliary H is applied to 99.9 kg of polycarbonate A by tumbling in a drum at room temperature and the material is then extruded on an extruder at 280° C. to give a strand which is granulated. The mould release behaviour is tested as in Example 1. The properties are described in Tables 1 and 2.

EXAMPLE 11 (COMPARATIVE EXAMPLE)

0.1 kg mould release auxiliary H1 is applied to 99.9 kg of polycarbonate A by tumbling in a drum at room temperature and the material is then extruded on an extruder at 280° C. to give a strand which is granulated. The mould release behaviour is tested as in Example 1. The properties are described in Tables 1 and 2.

EXAMPLE 12

0.1 kg mould release auxiliary G1 is applied to 99.9 kg of polycarbonate A by tumbling in a drum at room temperature and the material is then extruded on an extruder at 280° C. to give a strand which is granulated. The mould release behaviour is tested as in Example 1. The properties are described in Tables 1 and 2.

EXAMPLE 13

0.1 kg mould release auxiliary G2 is applied to 99.9 kg of polycarbonate A by tumbling in a drum at room temperature and the material is then extruded on an extruder at 280° C. to give a strand which is granulated. The mould release behaviour is tested as in Example 1. The properties are described in Tables 1 and 2.

Table 1

| | Mould release behaviour of the various polycarbonates | Mould release pressure (in bars) at mould release temperature °C | | |
|---|---|---|---|---|
| Examples | Composition | 150° C. | 160° C. | 170° C. |
| 1 | 100% of PC A, | 40 | 30 | 85 |
| 2 | 99.9% of PC A, 0.1% of mould release agent D | 19 | 9 | 4 |
| 3 | 99.99% of PC A 0.01% of mould release agent D | 26 | 22 | 40 |
| 4 | 100% of PC B | 44 | 36 | 80 |
| 5 | 99.9% of PC B 0.1% of mould release agent E | 22 | 12 | 22 |
| 6 | 100% of PC C | 48 | 35 | 82 |
| 7 | 99.9% of PC C 0.1% of mould release agent F | 16 | 9 | 7 |
| 8 | 99.9% of PC A 0.1% of mould release agent G | 16 | 10 | 8 |
| 9 | 99.9% of PC A 0.5% of mould release agent H | 40 | 15 | 37 |
| 10 | 99.9% of PC A 0.1% of mould release agent H | 40 | 25 | 80 |
| 11 | 99.9% of PC A 0.1% of mould release agent H1 | 20 | 10 | 5 |
| 12 | 99.9% of PC A 0.1% of mould release agent G1 | 20 | 11 | 6 |
| 13 | 99.9% of PC A 0.1% of mould release agent G2 | 18 | 10 | 8 |

Table 2

Mouldings injection-moulded from the polycarbonates of Examples 1-13 at 270° C. have the following properties:

| | Dimension | DIN | 1 | 2 | 3 | 4 | 5 | 6 | 7 | 8 | 9 | 10 | 11 | 12 | 13 |
|---|---|---|---|---|---|---|---|---|---|---|---|---|---|---|---|
| $\eta_{rel}$ | | | 1.30 | 1.29 | 1.30 | 1.33 | 1.31 | 1.28 | 1.27 | 1.29 | 1.28 | 1.29 | 1.29 | 1.29 | 1.29 |
| Elongation at break | % | 53,455 | 120 | 110 | 111 | 100 | 103 | 120 | 115 | 110 | 115 | 110 | 110 | 109 | 110 |
| Notched impact strength | KJ/m$^2$ | 53,453 | 44 | 42 | 43 | 38 | 41 | 46 | 45 | 43 | 36 | 40 | 43 | 42 | 41 |
| Vicat B | °C. | 53,460 | 150 | 150 | 151 | 155 | 153 | 156 | 155 | 151 | 145 | 146 | 150 | 150 | 149 |
| Elongation at break after heat treatment+ | % | 53,455 | 115 | 105 | 115 | 100 | 96 | 120 | 108 | 111 | 60 | 80 | 100 | 104 | 105 |
| Vicat B after heat treatment+ | °C. | 53,460 | 150 | 148 | 150 | 154 | 153 | 154 | 153 | 148 | 135 | 140 | 148 | 149 | 149 |
| $\eta_{rel}$ after heat treatment+ | | | 1.30 | 1.29 | 1.30 | 1.32 | 1.30 | 1.28 | 1.27 | 1.28 | 1.26 | 1.27 | 1.29 | 1.29 | 1.29 |

+The heat treatment was carried out for 300 hours at 130° C. in air.

What we claim is:

1. A thermoplastic moulding composition comprising a high molecular thermoplastic aromatic polycarbonate based on an aromatic dihydroxy compound and containing 0.01 to 0.5% by weight of a partial ester of a saturated aliphatic carboxylic acid with 10 to 20 C atoms per molecule and an aromatic hydroxy compound with from 1 to 6 OH groups.

2. A thermoplastic moulding composition according to claim 1 containing from 0.05 to 0.1% by weight of the said partial ester.

3. A thermoplastic moulding composition according to claim 1 in which the said polycarbonate has a weight-average molecular weight of from 10,000 to 200,000.

4. A composition according to claim 1 wherein the aromatic polycarbonate is derived from a bisphenol of the formulae (I):

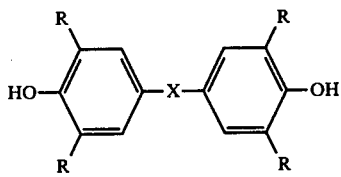

in which
R is identical or different and denotes H, C$_1$–C$_4$-alkyl, Cl or Br and in which
X is a bond, C$_1$–C$_8$-alkylene, C$_2$–C$_8$-alkylidene, C$_5$–C$_{15}$-cycloalkylene, C$_5$–C$_{15}$-cycloalkylidene, —SO$_2$— or

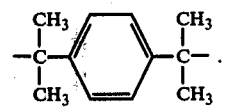

5. The thermoplastic moulding composition according to claim 1 wherein the said polyester is a partial ester selected from the group consisting of phloroglucinol distearate, phloroglucinol palmitate, 1,4-bis((4,4'-dihydroxy-triphenyl)-methyl)benzene tetramyristate, hexahydroxybenzene pentastearate, tretramethyl-bisphenol A-palmitate, and 1,4-bis((4,4'-dihydroxy-triphenyl)methyl)benzene tristearate.

6. The thermoplastic moulding composition according to claim 1 wherein the said polyester is a partial ester selected from the group consisting of phloroglucinol distearate, tetramethyl-bisphenol A-palmitate, 1,4-bis((4,4'-dihydroxytriphenyl)methyl)benzene tristearate.

7. A process for producing moulded articles which comprises injection moulding a composition according to claim 1.

8. A moulded article formed from the composition according to claim 1.